(12) United States Patent
Kim et al.

(10) Patent No.: US 8,818,282 B2
(45) Date of Patent: Aug. 26, 2014

(54) CLOCK SHARING BETWEEN CORES ON AN INTEGRATED CIRCUIT

(75) Inventors: Beomsup Kim, Cupertino, CA (US); Tzu-Wang Pan, Saratoga, CA (US); Young Gon Kim, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 199 days.

(21) Appl. No.: 13/357,830

(22) Filed: Jan. 25, 2012

(65) Prior Publication Data

US 2013/0040583 A1  Feb. 14, 2013

Related U.S. Application Data

(60) Provisional application No. 61/522,580, filed on Aug. 11, 2011.

(51) Int. Cl.
H04B 1/00 (2006.01)

(52) U.S. Cl.
USPC ................................ 455/42; 375/327; 455/76

(58) Field of Classification Search
USPC ............................................ 455/41.1, 76, 88
See application file for complete search history.

(56) References Cited

U.S. PATENT DOCUMENTS

| 6,424,826 | B1 | 7/2002 | Horton et al. |
| 7,082,292 | B2 | 7/2006 | Underbrink |
| 7,151,915 | B2 * | 12/2006 | Heinonen et al. ............. 455/255 |
| 7,551,131 | B2 | 6/2009 | Jin |
| 7,759,972 | B1 * | 7/2010 | Shumarayev et al. .......... 326/41 |
| 8,521,115 | B2 * | 8/2013 | Leon .............................. 455/260 |
| 2009/0088085 | A1 | 4/2009 | Nilsson et al. |
| 2009/0221235 | A1 | 9/2009 | Ciccarelli et al. |
| 2009/0231188 | A1 | 9/2009 | Yanni et al. |
| 2010/0069085 | A1 | 3/2010 | Hammes et al. |
| 2010/0080210 | A1 * | 4/2010 | Kim ................................ 370/350 |
| 2010/0137025 | A1 * | 6/2010 | Tal et al. ..................... 455/553.1 |
| 2010/0330931 | A1 | 12/2010 | Uehara et al. |
| 2012/0139594 | A1 * | 6/2012 | Leon .............................. 327/156 |
| 2012/0230457 | A1 * | 9/2012 | Chern et al. .................. 375/371 |
| 2013/0080495 | A1 * | 3/2013 | Staszewski et al. ........... 708/670 |

OTHER PUBLICATIONS

Heng, et al., "A 1.8GHz CMOS Fractional-N Frequency Synthesizer with Randomized Multi-Phase VCO," IEEE 2002 Custom Integrated Circuits Conference, pp. 427-430.

Park, et al., "A 1.8GHz Self-Calibrated Phase-Locked Loop with Precise I/Q Matching," IEEE Journal of Solid-State Circuits, vol. 36, No. 5, May 2001, pp. 777-783.

International Search Report and Written Opinion—PCT/U S2012/050466—ISA/EPO—May 21, 2013.

\* cited by examiner

*Primary Examiner* — Creighton Smith
(74) *Attorney, Agent, or Firm* — William M. Hooks

(57) ABSTRACT

An integrated circuit is described. The integrated circuit includes a global positioning system core that generates a GPS clock signal using an inductor-capacitor voltage controlled oscillator. The integrated circuit also includes a transceiver core configured to use the GPS clock signal. The transceiver core may not include a voltage controlled oscillator.

32 Claims, 10 Drawing Sheets

CLOCK SHARING BETWEEN CORES ON AN INTEGRATED CIRCUIT

CLAIM OF PRIORITY UNDER 35 U.S.C. §119

The present Application for Patent claims priority to Provisional Application No. 61/522,580 entitled "CLOCK SHARING BETWEEN CORES ON AN INTEGRATED CIRCUIT" filed Aug. 11, 2011, and assigned to the assignee hereof and hereby expressly incorporated by reference herein.

TECHNICAL FIELD

The present disclosure relates generally to electronic communications. More specifically, the present disclosure relates to systems and methods for clock sharing between cores on an integrated circuit.

BACKGROUND

Wireless communication systems are widely deployed to provide various types of communication content such as voice, video, data, and so on. These systems may be multiple-access systems capable of supporting simultaneous communication of multiple wireless communication devices with one or more base stations.

For proper reception and transmission of wireless signals on a wireless communication network, a wireless communication device may use one or more voltage controlled oscillators (VCO) to generate a signal with a desired frequency. Wireless communication device and/or wireless communication system specifications may require that the amplitude of the signal generated meets certain requirements while the signal also maintains high levels of reliability. In addition, a wireless communication device may operate using batteries. Reductions in the power consumption and/or die area used to generate the signals with the desired frequency may thus be beneficial.

SUMMARY

An integrated circuit is disclosed. The integrated circuit includes a first core that generates a clock signal using an inductor-capacitor voltage controlled oscillator. The integrated circuit also includes a second core configured to use the clock signal.

The first core may be a global positioning system core. The clock signal may be a GPS clock signal. The second core may be a transceiver core. The transceiver core may not include a voltage controlled oscillator. The transceiver core may be a Bluetooth core, a wireless fidelity core, a cellular core or an FM transceiver core.

The FM transceiver core may include an FM transmitter and an FM receiver. The FM receiver may include a delay locked loop based inphase/quadrature generator that uses the GPS clock signal to generate an inphase/quadrature for Rx signal. The inphase/quadrature for Rx signal may be mixed with a receive signal to obtain a baseband signal. The delay locked loop based inphase/quadrature generator may be implemented using delay locked loop based phase counting frequency division. The delay locked loop based inphase/quadrature generator may include a series of delay units coupled to phase selector and counter logic. The phase selector and counter logic may include multiple switches. Adjusting a phase and turn-on time for each switch adjusts a frequency output of the phase selector and counter logic.

The FM transmitter may include a ring voltage controlled oscillator based phase locked loop. The ring voltage controlled oscillator based phase locked loop may receive a temperature compensated crystal oscillator signal from an external temperature compensated crystal oscillator. The ring voltage controlled oscillator based phase locked loop may include a phase frequency detector/charge pump, a low pass filter and multiple delay units. The integrated circuit may be a system-on-a-chip.

A method for sharing a clock signal between a first core and a second core on an integrated circuit is also described. A clock signal is generated using an inductor-capacitor voltage controlled oscillator in the first core on the integrated circuit. The clock signal is provided to the second core on the integrated circuit. The clock signal is used to receive signals on the second core.

An apparatus configured for sharing a clock signal between a first and a second core on an integrated circuit is described. The apparatus includes means for generating a clock signal using an inductor-capacitor voltage controlled oscillator in the first core on the integrated circuit. The apparatus also includes means for providing the clock signal to the second core on the integrated circuit. The apparatus further includes means for using the clock signal to receive signals on the second core.

A computer-program product for sharing a clock signal between a first core and a second core is also described. The computer-program product includes a non-transitory computer-readable medium having instructions thereon. The instructions include code for causing an electronic device to generate a clock signal using an inductor-capacitor voltage controlled oscillator in the first core. The instructions also include code for causing the electronic device to provide the clock signal to the second core. The instructions further include code for causing the electronic device to use the clock signal to receive signals on the second core.

DETAILED DESCRIPTION

Figure 1:
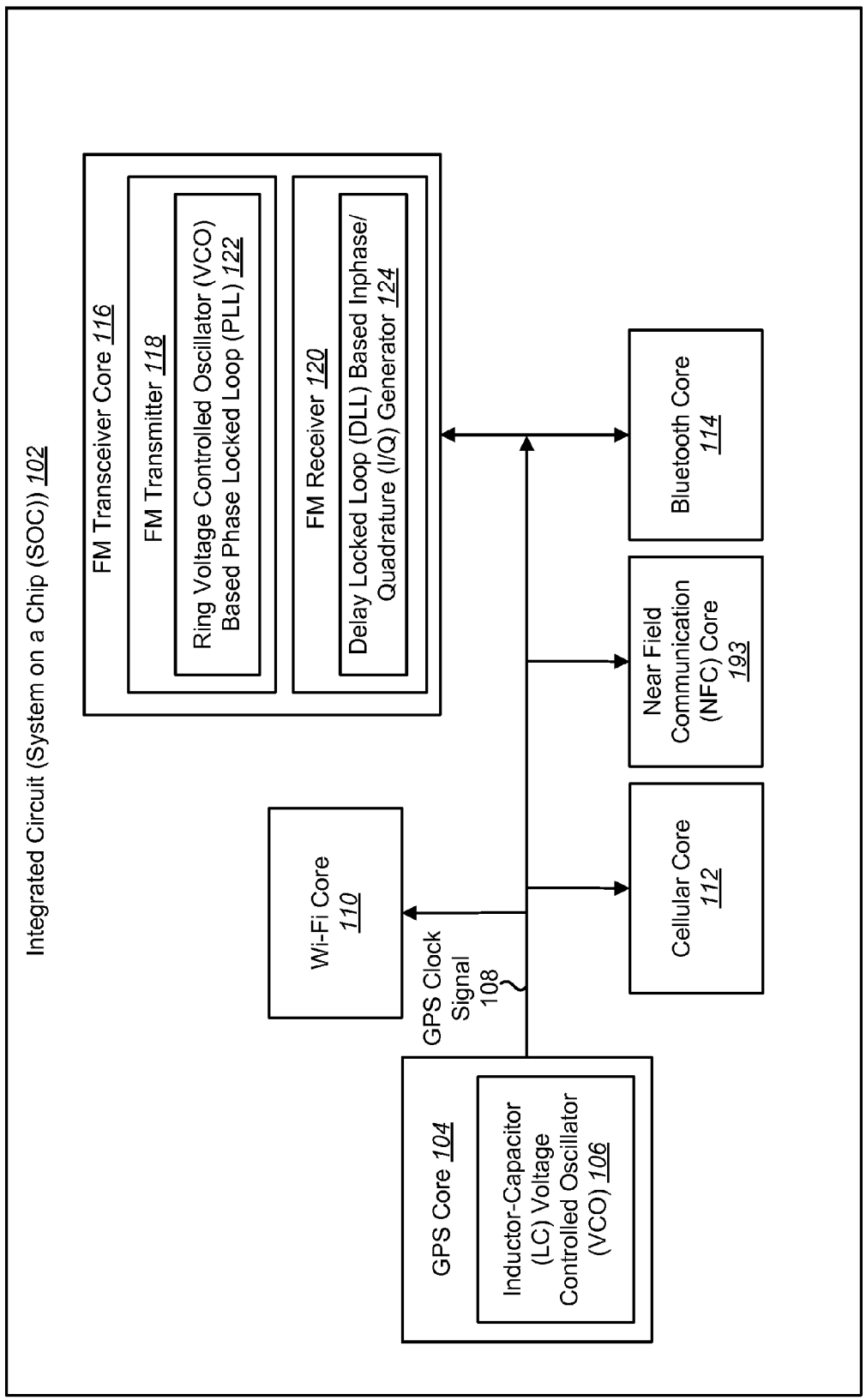
FIG. 1 is a block diagram illustrating an integrated circuit with multiple cores.

FIG. 1 is a block diagram illustrating an integrated circuit 102 with multiple cores. The integrated circuit 102 may be a system-on-a-chip (SOC). A system-on-a-chip (SOC) refers to the integrating of all components of a computer or other electronic device onto one integrated circuit 102. Thus, a system-on-a-chip (SOC) may include analog circuitry, digital circuitry and radio frequency (RF) circuitry. As the use of system-on-a-chip (SOC) becomes more popular, more and more cores may be integrated within a single silicon integrated circuit 102. These cores may include a Global Positioning System (GPS) core 104, a Wireless Fidelity (Wi-Fi) core 110, a cellular core 112, a Bluetooth core 114, a near field communication (NFC) core 193 and an FM transceiver core 116. These cores may be stand alone products with all the crucial building blocks necessary to implement the functionality present on each core. The integrated circuit 102 may be located on an electronic device or a wireless device. An electronic device or wireless device may be an access terminal, a mobile station, a wireless communication device, a user equipment (UE), a base station, a Node B, an evolved Node B, a handheld electronic device, a GPS device, etc.

To free up space on a system-on-a-chip (SOC), some of the cores may share crucial building blocks that are compatible between different cores. Some of the crucial building blocks, such as a radio frequency (RF) front end, are not compatible between different cores. However, other building blocks, such as a frequency synthesizer, may be shared between different cores if certain conditions are met. One such crucial building block is clock generation circuitry. Clock generation circuitry, such as an inductor-capacitor (LC) voltage controlled oscillator (VCO) 106, may use large amounts of space on the integrated circuit 102 that could otherwise be used for additional circuitry. By sharing clock generation circuitry, a system-on-a-chip (SOC) may use less power and become more economically feasible.

Power and area saving are both critical parameters. Reduced power consumption increases the usage time of a wireless device. Reduced area may reduce the cost of a die. As technology scales down, the area occupied by active devices on the integrated circuit 102 are reduced dramatically. However, the size of passive devices such as inductors (L) and capacitors (C) are comparable between different scale technologies. In other words, the size of these passive devices does not decrease as the area occupied by active devices gets smaller. For this reason, the area occupied by passive devices becomes more and more prominent as the industry migrates into deep sub-micron technology. This is true for inductor-capacitor (LC) voltage controlled oscillators (VCOs) 106.

The GPS core 104 may include an inductor-capacitor (LC) voltage controlled oscillator (VCO) 106. The inductor-capacitor (LC) voltage controlled oscillator (VCO) 106 may generate a GPS clock signal 108 with a frequency of 3 gigahertz (GHz). Because the frequency of the GPS clock signal 108 does not vary with time or geography and because the GPS clock signal 108 generated by the GPS core 104 is always available during operation (e.g., the GPS core 104 is never turned off), reusing the GPS clock signal 108 for other transceiver cores is an attractive option. An inductor-capacitor (LC) voltage controlled oscillator (VCO) 106 may require a lot of power consumption to achieve a high quality factor (Q) oscillation at multiple gigahertz (GHz). Therefore, removing an inductor-capacitor (LC) voltage controlled oscillator (VCO) 106 from the integrated circuit 102 (i.e., removing an inductor-capacitor (LC) voltage controlled oscillator (VCO) 106 from a transceiver core other than the GPS core 104) may significantly reduce power consumption of the integrated circuit 102 if a low noise clock signal can be obtained elsewhere. The GPS clock signal 108 may be used in transceiver cores such as the Wi-Fi core 110, the FM transceiver core 116, the cellular core 112 and/or the Bluetooth core 114.

The FM transceiver core 116 may include an FM transmitter 118 and an FM receiver 120. To meet the challenging noise requirements for the FM receiver 120, a dedicated inductor-capacitor (LC) oscillator (such as a voltage controlled oscillator (VCO)) is normally implemented. Removing the dedicated inductor-capacitor (LC) oscillator may save chip space and reduce power consumption. The FM receiver 120 may need low noise inphase/quadrature (I/Q) signals to properly receive FM signals. The FM receiver 120 may include a delay locked loop (DLL) based inphase/quadrature (I/Q) generator 124 that uses the GPS clock signal 108 to generate the low noise inphase/quadrature (I/Q) signals. Thus, the FM transceiver core 116 may not need the dedicated inductor-capacitor (LC) oscillator for operation. The FM transceiver core 116 may reuse the GPS clock signal 108 because FM is a time division duplexing (TDD) system and thus does not transmit and receive during the same time periods. The GPS clock signal 108 may also be used for frequency division duplexing (FDD) systems. The FM transmitter 118 may include a ring voltage controlled oscillator (VCO) based phase locked loop (PLL) 122 and an external temperature compensated crystal oscillator (TXCO) to generate a ~100 megahertz (MHz) transmit output signal with significant reduction in cost compared to using a dedicated inductor-capacitor (LC) voltage controlled oscillator (VCO) for the FM transceiver core 116. Because the FM transmitter 118 uses a Sigma-Delta modulator to achieve FM data modulation, the FM transmitter 118 may be unable to use the GPS clock signal 108. However, if the FM transmitter used another type of modulator, the GPS clock signal 108 may also be used for the FM transmitter.

Figure 2:
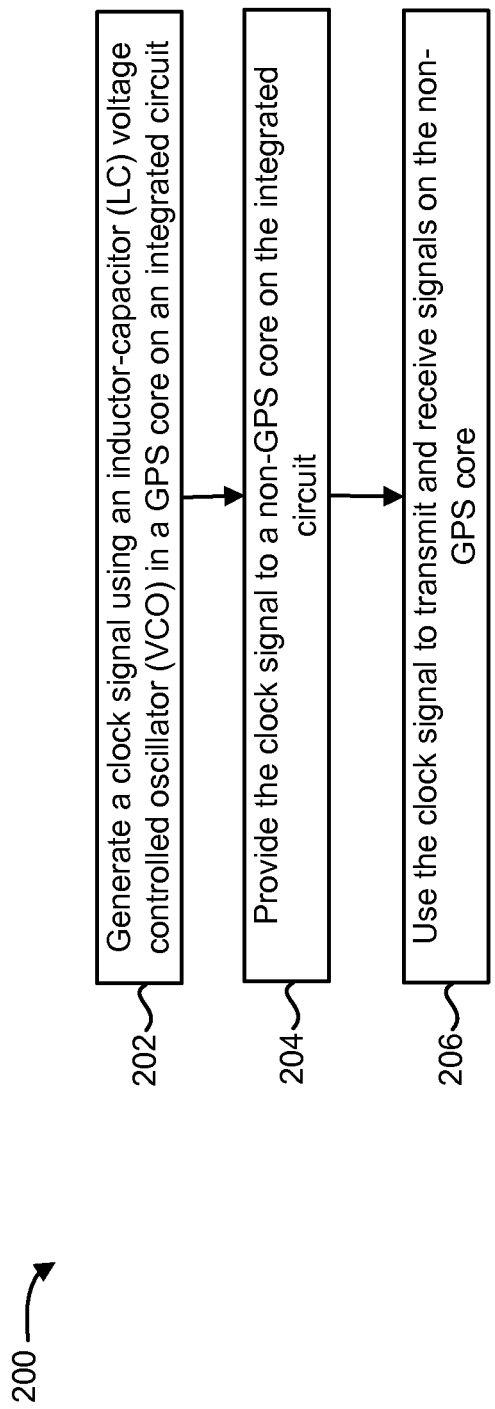
FIG. 2 is a flow diagram of a method for sharing a clock signal between cores on an integrated circuit.

FIG. 2 is a flow diagram of a method 200 for sharing a clock signal between cores on an integrated circuit 102. The method 200 may be performed by the integrated circuit 102. In one configuration, the integrated circuit 102 may be a system-on-a-chip (SOC). The integrated circuit 102 may be located on an electronic device or a wireless device. Thus, in one configuration, the method 200 may be performed by an electronic device or a wireless device.

The integrated circuit 102 may generate 202 a clock signal using an inductor-capacitor (LC) voltage controlled oscillator (VCO) 106 in a GPS core 104 on the integrated circuit 102. The generated clock signal may thus be a GPS clock signal 108. The integrated circuit may provide 204 the clock signal to a non-GPS core on the integrated circuit 102. A non-GPS core may be a Wi-Fi core 110, an FM transceiver core 116, a cellular core 112 or a Bluetooth core 114. The integrated circuit 102 may then use 206 the clock signal to transmit and receive signals on the non-GPS core. For example, the integrated circuit 102 may use the clock signal in conjunction with a mixer to mix a received signal or a transmit signal to the appropriate frequency.

Figure 3:
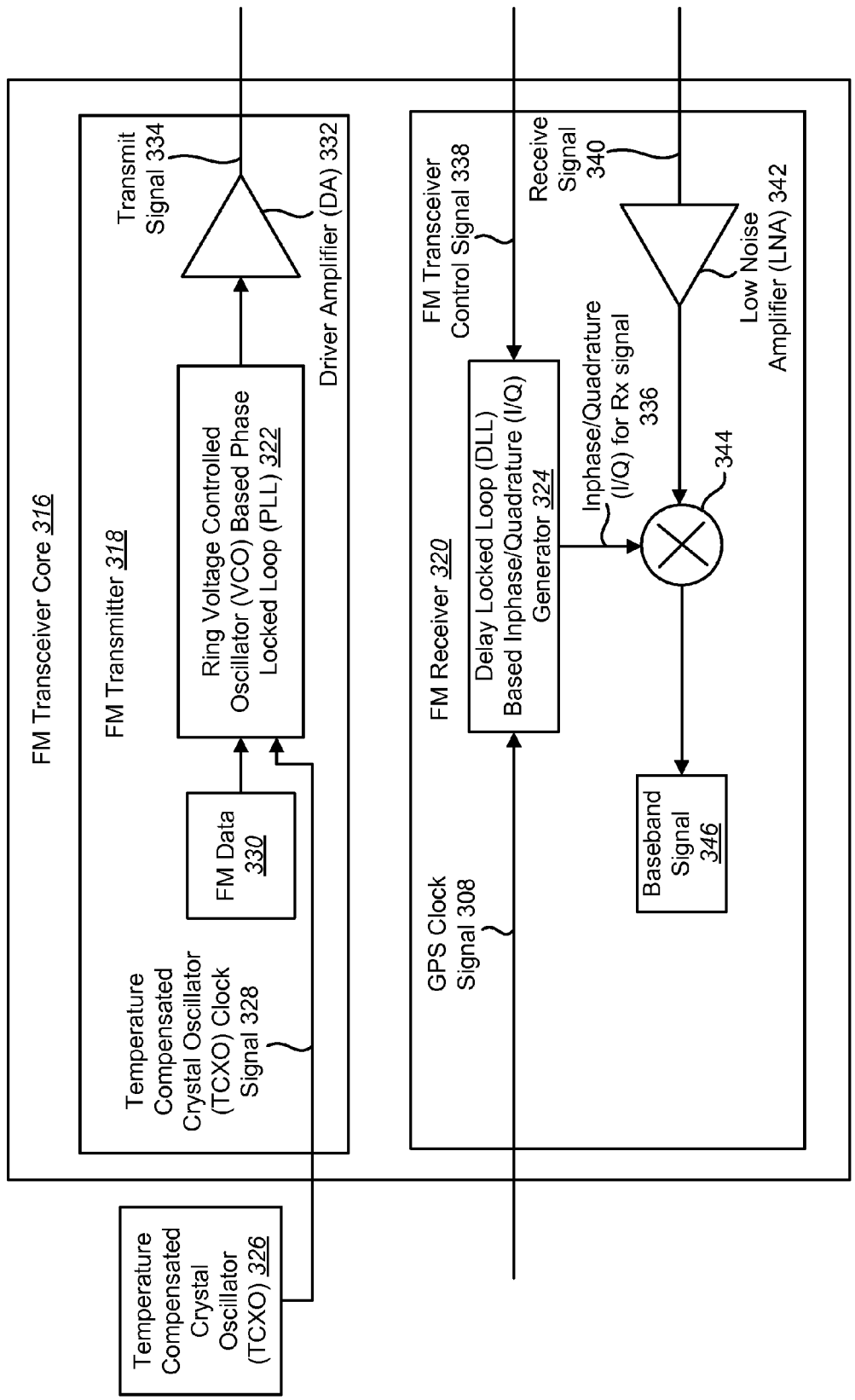
FIG. 3 is a block diagram of an FM transceiver core for use in the present systems and methods.

FIG. 3 is a block diagram of an FM transceiver core 316 for use in the present systems and methods. The FM transceiver core 316 of FIG. 3 may be one configuration of the FM transceiver core 116 of FIG. 1. The FM transceiver core 316 may be on an integrated circuit 102 that also includes a GPS core 104 with an inductor-capacitor (LC) voltage controlled oscillator (VCO) 106. The FM transceiver core 316 may include an FM transmitter 318 and an FM receiver 320.

The FM transmitter 318 may include a ring voltage controlled oscillator (VCO) based phase locked loop (PLL) 322. The ring voltage controlled oscillator (VCO) based phase locked loop (PLL) 322 may be used by the FM transmitter 318 for FM transmit signal modulation. The ring voltage controlled oscillator (VCO) based phase locked loop (PLL) 322 may receive FM data 330 for transmission. The ring voltage controlled oscillator (VCO) based phase locked loop (PLL) 322 may also receive a temperature compensated crystal oscillator (TXCO) clock signal 328 from a temperature compensated crystal oscillator (TXCO) 326. The ring voltage controlled oscillator (VCO) based phase locked loop (PLL) 322 is discussed in additional detail below in relation to FIG. 7. The ring voltage controlled oscillator (VCO) based phase locked loop (PLL) 322 may be coupled to a driver amplifier (DA) 332. The driver amplifier (DA) 332 may then output a transmit signal 334 to an antenna. The ring voltage controlled oscillator (VCO) based phase locked loop (PLL) 322 may occupy much less die area on the integrated circuit 102 than an inductor-capacitor (LC) voltage controlled oscillator (VCO) 106. A Sigma-Delta modulator (not shown) may be included within the ring voltage controlled oscillator (VCO) based phase locked loop (PLL) 322. Typically a ring voltage controlled oscillator (VCO based phase locked loop (PLL) 322 is not used in an FM transmitter 318 for a System on a Chip (SOC) because the FM receiver 320 includes an inductor-capacitor (LC) oscillator. However, the ring voltage controlled oscillator (VCO) based phase locked loop (PLL) 322 may be necessary when the FM receiver 320 does not include an inductor-capacitor (LC) oscillator.

The FM receiver 320 may include a delay locked loop (DLL) based inphase/quadrature (I/Q) generator 324. The delay locked loop (DLL) based inphase/quadrature (I/Q) generator 324 may receive a GPS clock signal 308 from a GPS core 104 located on the same integrated circuit 102 as the FM receiver 320. The delay locked loop (DLL) based inphase/quadrature (I/Q) generator 324 may also receive an FM transceiver control signal 338 that controls the receive frequency of the FM receiver 320. The delay locked loop (DLL) based inphase/quadrature (I/Q) generator 324 may generate an inphase/quadrature (I/Q) for Rx signal 336. The delay locked loop (DLL) based inphase/quadrature (I/Q) generator 324 is discussed in additional detail below in relation to FIG. 5. The inphase/quadrature (I/Q) for Rx signal 336 may be input to a mixer 344. The FM receiver 320 may receive a receive signal 340 from an antenna. The receive signal 340 may be amplified by a low noise amplifier (LNA) 342. The amplified receive signal 340 may then also be input to the mixer 344. The mixer 344 may output a baseband signal 346. Thus, the mixer 344 may mix the received signal 340 to the appropriate frequency.

The delay locked loop (DLL) based inphase/quadrature (I/Q) generator 324 may be implemented using Direct Digital Synthesis (DDS). In Direct Digital Synthesis (DDS), each point of waveforms is saved in random access memory (RAM) and a synthesized output is created by combining the saved data points. A Direct Digital Synthesis (DDS) implementation may require additional circuitry, such as a digital-to-analog converter (DAC) and random access memory (RAM). The Direct Digital Synthesis (DDS) implementation may be more suitable for a low frequency synthesis (generally less than 100 MHz).

The delay locked loop (DLL) based inphase/quadrature (I/Q) generator 324 may also be implemented using delay locked loop (DLL) based edge-combining frequency synthesis/division. In delay locked loop (DLL) based edge-combining frequency synthesis/division, the edges from multiple phases from a delay line may be combined to generate an output frequency that is either multiplied or divided. The resolution may be limited to the unit delay of a delay cell used. Delay locked loop (DLL) based edge-combining frequency synthesis/division is more suitable for an integer-N divider with a large unit frequency step.

The delay locked loop (DLL) based inphase/quadrature (I/Q) generator 324 may also be implemented using delay locked loop (DLL) based phase counting frequency division. A fractional division on average may be achieved by counting different phases during different times. A delay locked loop (DLL) based phase counting frequency division is a proven technique from multi-channel digital communication and is suitable for ~100 MHz range fractional division applications. The delay locked loop (DLL) based phase counting frequency division implementation is discussed in additional detail below in relation to FIG. 5. Delay locked loop (DLL) based phase counting frequency division may generate necessary fractional frequency division. To materialize delay locked loop (DLL) based phase counting frequency division, heavy system simulations may be required to find a realistic structure.

Figure 4:
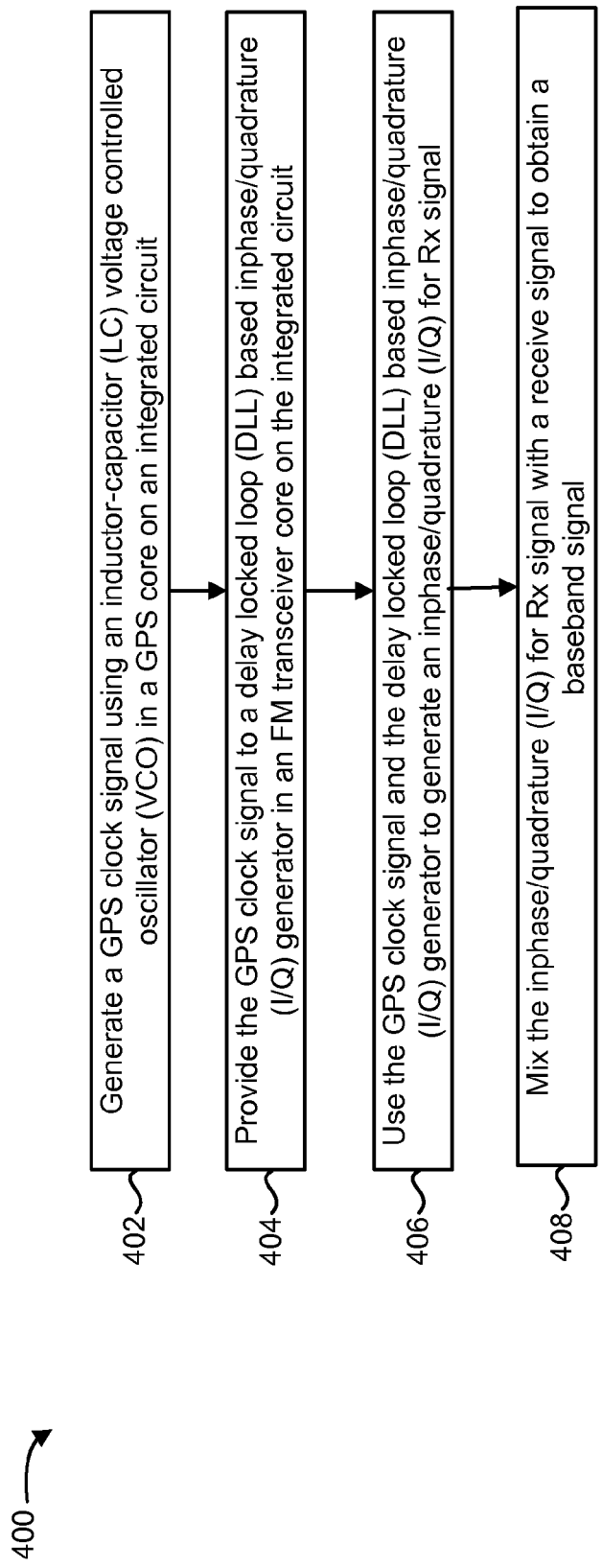
FIG. 4 is a flow diagram of a method for sharing a GPS clock signal between a GPS core and an FM transceiver core on an integrated circuit.

FIG. 4 is a flow diagram of a method 400 for sharing a GPS clock signal 108 between a GPS core 104 and an FM transceiver core 116 on an integrated circuit 102. The method 400 may be performed by the integrated circuit 102. In one configuration, the integrated circuit 102 may be a system-on-a-chip (SOC). The integrated circuit 102 may be located on an electronic device or a wireless device. Thus, in one configuration, the method 400 may be performed by an electronic device or a wireless device.

The integrated circuit 102 may generate 402 a GPS clock signal 108 using an inductor-capacitor (LC) voltage controlled oscillator (VCO) 106 in a GPS core 104 on the integrated circuit 102. The integrated circuit 102 may provide 404 the GPS clock signal 108 to a delay locked loop (DLL) based inphase/quadrature (I/Q) generator 124 in a FM transceiver core 116 on the integrated circuit 102. The integrated circuit 102 may use 406 the GPS clock signal 108 and the delay locked loop (DLL) based inphase/quadrature (I/Q) generator 124 to generate an inphase/quadrature (I/Q) for Rx signal 336. The integrated circuit 102 may then mix 408 the inphase/quadrature (I/Q) for Rx signal 336 with a receive signal 340 to obtain a baseband signal 346. Thus, the FM transceiver core 116 may properly receive FM signals without requiring a dedicated inductor-capacitor (LC) voltage controlled oscillator (VCO), resulting in significant power savings and die area savings.

Figure 5:
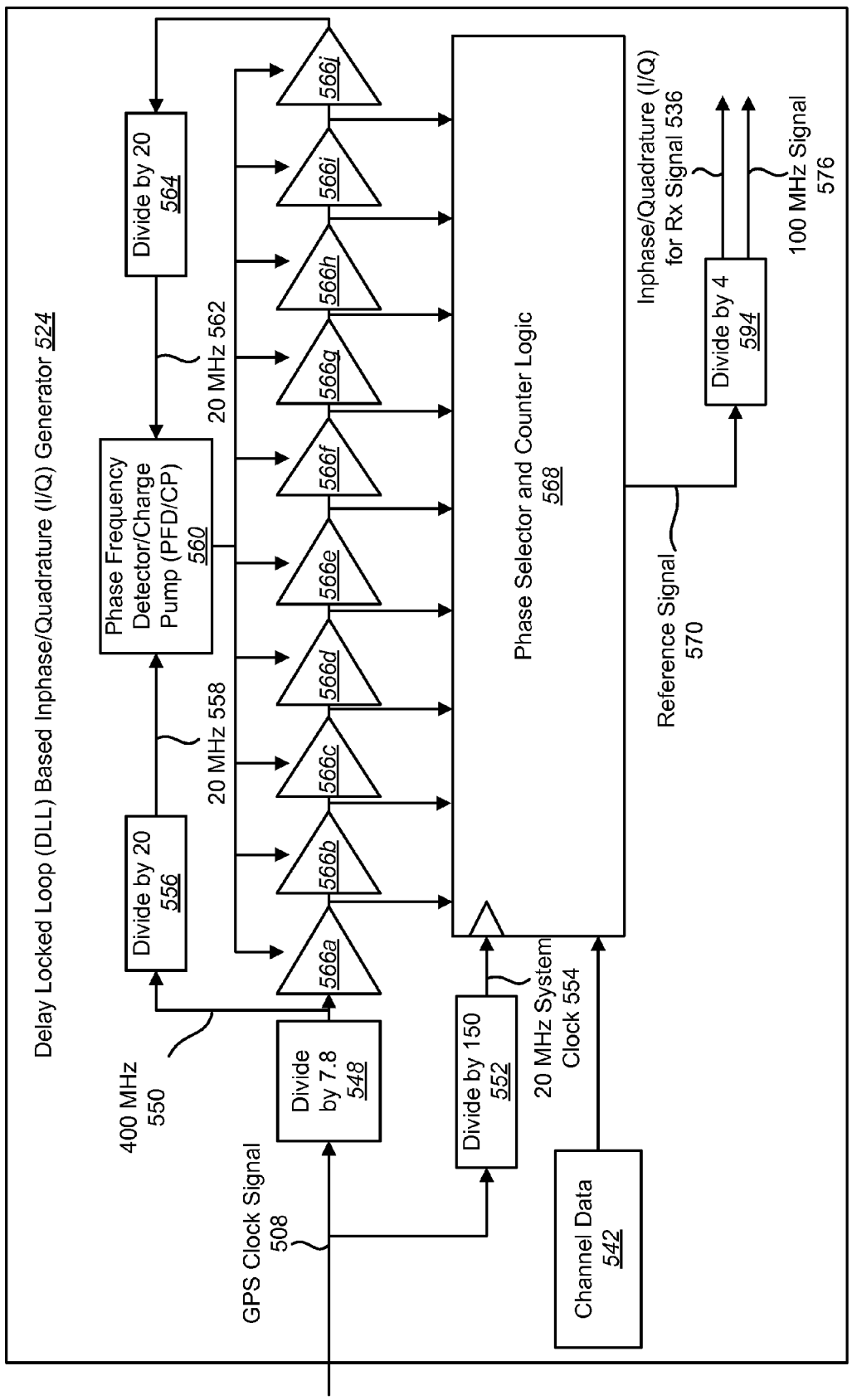
FIG. 5 is a block diagram illustrating a delay locked loop (DLL) based inphase/quadrature (I/Q) generator for use in the present systems and methods.

FIG. 5 is a block diagram illustrating a delay locked loop (DLL) based inphase/quadrature (I/Q) generator 524 for use in the present systems and methods. The delay locked loop (DLL) based inphase/quadrature (I/Q) generator 524 of FIG. 5 may be one configuration of the delay locked loop (DLL) based inphase/quadrature (I/Q) generator 124 of FIG. 1. The delay locked loop (DLL) based inphase/quadrature (I/Q) generator 524 of FIG. 5 is a delay locked loop (DLL) based phase counting frequency division implementation.

The delay locked loop (DLL) based inphase/quadrature (I/Q) generator 524 may receive the GPS clock signal 508 from the GPS core 104. The GPS clock signal 508 may be divided 548 by 7.8 (using digital circuitry) to obtain a 400 MHz signal 550. The 400 MHz signal 550 may be divided 556 by 20 to obtain a 20 MHz signal 558. The 20 MHz signal 558 may then be input to a phase frequency detector/charge pump (PFD/CP) 560.

The 400 MHz signal 550 may also be passed through a sequence of delay units 566a-j. The delay units 566a-j may be controlled by the phase frequency detector/charge pump (PFD/CP) 560. The output of each delay unit 566 may be input to a phase selector and counter logic 568 and to the input of the next delay unit 566 (i.e., the output of the first delay unit 566a is input to the second delay unit 565b). The output of the final delay unit 566j may be divided 564 by 20 to obtain a 20

MHz feedback signal 562 that is also input to the phase frequency detector/charge pump (PFD/CP) 560. The phase selector and counter logic 568 is discussed in additional detail below in relation to FIG. 6.

The GPS clock signal 508 may also be divided 552 by 150 to obtain a 20 MHz system clock 554 used by the phase selector and counter logic 568. The phase selector and counter logic 568 may also receive channel data 542. The phase selector and counter logic 568 may output an approximately 400 MHz reference signal 570 (depending on the channel frequency). The approximately 400 MHz reference signal 570 may be input to a divide by 4 block 594 to obtain a 100 MHz signal 576 and the inphase/quadrature (I/Q) for Rx signal 536. As an example, if a 100.2 MHz signal is needed for the FM receiver 120, the phase selector and counter logic 568 may be used to obtain the appropriate inphase/quadrature (I/Q) for Rx signal 536.

The 100 MHz signal 576 is used for the FM channel. To demodulate the received FM channel data, the inphase/quadrature (I/Q) for the Rx signal 536 needs to be locally generated at the particular channel frequency. The phase selector and counter logic 568 may use fractional division to obtain a signal that is four times the FM channel frequency. For example, if the final channel frequency is 92.5 MHz, the reference signal 570 may be 4×92.5 MHz=370 MHz. From the GPS core 104, the GPS clock signal 508 is exactly 3.176 GHz. The phase selector and counter logic may divide the GPS clock signal 508 by 8.5837 to obtain the 370 MHz reference signal 570. The 370 MHz reference signal 570 may then be sent through the divide by 4 block 594 to obtain the inphase/quadrature (I/Q) for Rx signal 536 at the required 92.5 MHz.

Figure 6:
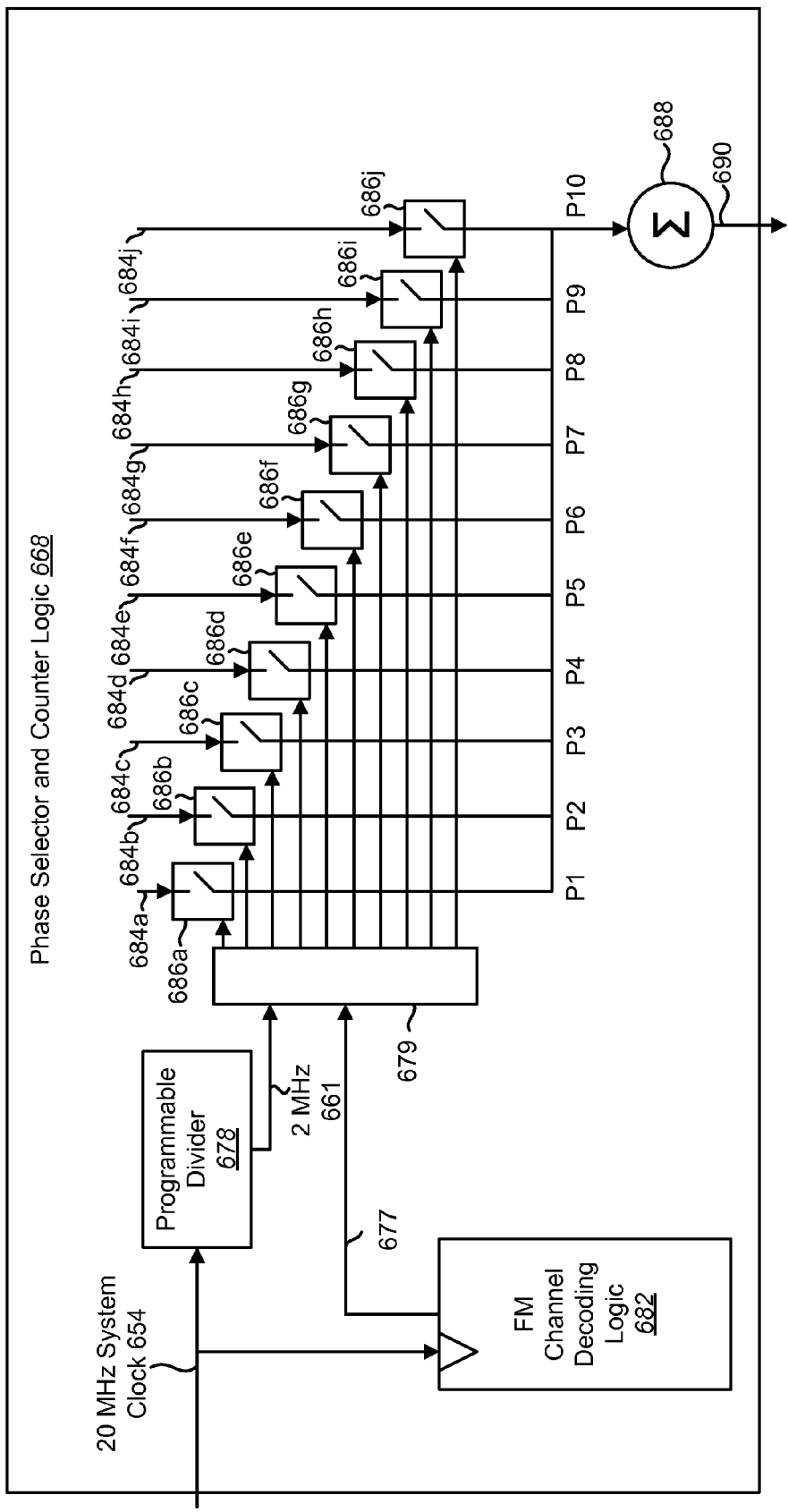
FIG. 6 is a block diagram illustrating a phase selector and counter logic for use in the present systems and methods.

FIG. 6 is a block diagram illustrating a phase selector and counter logic 668 for use in the present systems and methods. The phase selector and counter logic 668 of FIG. 6 may be one configuration of the phase selector and counter logic 568 of FIG. 5. The phase selector and counter logic 668 may receive a 20 MHz system clock 654 (i.e., the GPS clock signal 508 divided 552 by 150). The 20 MHz system clock 654 may be input to a programmable divider 678 and to FM channel decoding logic 682.

The programmable divider 678 may output a 2 MHz signal 661 to a controller 679. The controller 679 may also receive instructions 677 from the FM channel decoding logic 682. The controller 679 may control multiple switches P1-P10 686*a-j* in the phase selector and counter logic 668. Each of the switches P1-P10 686*a-j* may couple a delay signal 684*a-j* output from the delay units 566 in the delay locked loop (DLL) based inphase/quadrature (I/Q) generator 524 to an adder 688. By turning on the switches 686*a-j* sequentially from P1 to P10 each for 50 nanoseconds (ns), the phase selector and counter logic 668 may generate up to 20 counts per each phase. By changing the turn-on time for each switch 686*a-j* as well as the number of switches 686*a-j* to be turned on, fractional division of the GPS clock signal 108 may be achieved in a signal 690 output by the phase selector and counter logic 668. For example, to obtain a frequency of 2 MHz (with a period of $$\frac{1}{2 \text{ MHz}} = 500 \text{ ns}),$$

a 400 MHz multiple phase input can be counted as many as 200 times.

Applications such as an FM transceiver core 116 are required to generate fractional division from the reference clock source to correctly match the channel frequency. The phase selector and counter logic 668 can also provide fractional division by multiple adjustments of the switches 668*a-j*. As an example, the incoming signals 684*a-j* may be assumed to be 400 MHz with different phases. One 400 MHz clock cycle may be represented as 4Td. In other words, ¼Td=400 MHz. It may also be assumed that the number of delay locked loop (DLL) phases is four (instead of ten). In real implementation, this number can be any number. If only four switches 686 are used (along with four input delay signals 684), then the first switch 686*a* can represent 400 MHz without a delay signal 684*a*. By the same token, the second switch 686*b* can represent 400 MHz with 0.25*(1/400 MHz)=1Td delay. Furthermore, the third switch 686*c* can represents 400 MHz with 2Td delay and the fourth switch 686*d* can represent 400 MHz with 3Td delay.

In one particular example, during one clock cycle of the 2 MHz input signal 661 (500 ns), only the second switch 686*b* and the third switch 686*c* are alternately turning on during a 7.5 ns (three clock cycles of a 400 MHz input signal) period. During the first 15 ns (6 clock cycles of the 400 MHz signal), the output signal 690 may include seven rising edges due to phase switching. If 15 ns can include seven rising edges, then the frequency can be calculated as 1/(2.14286 ns)=466.66 MHz. If this sequence is infinitely repeated, a stable output frequency of 466.66 MHz is achieved, which is a fraction of the input frequency. Later on, the 466.66 MHz output signal 690 may be divided by 4 to obtain the 116.66 MHz signal used to drive the FM transceiver core 116.

For example, if a switch 686 alternates between phase A (with a period of 4T) and Phase C (with a period of 3T), fractional division is possible. The average period may be (4+4+3+3+3+4+4+2)×T/7=3.42857T. The different edges during a counting cycle may then be counted to obtain fractional division. The incoming signal may be at 400 MHz. The 400 MHz signal may be passed through a 4-phase generating delay locked loop (DLL) to create phases A through D. One clock cycle may then be equal to 4T=1/400 MHz=2.5 nanoseconds (ns).

If the output phase selector chooses phase A first and then moves to phase C, the output clock cycles may change from 4T to 4T to 3T to 3t to 4T to 4T to 2T during the phase A to phase C transition. It may be assumed that this iteration is performed from phase A to phase C indefinitely every six cycles of input clock period. Thus, output average period is going to be 3.42857T all the time. By changing the phase selector, different output frequencies may be achieved. Since 4T=2.5 ns, 1/3.42857T=466.67 MHz. Using ten phases instead of four phases allows more dithering on the output spur.

Figure 7:
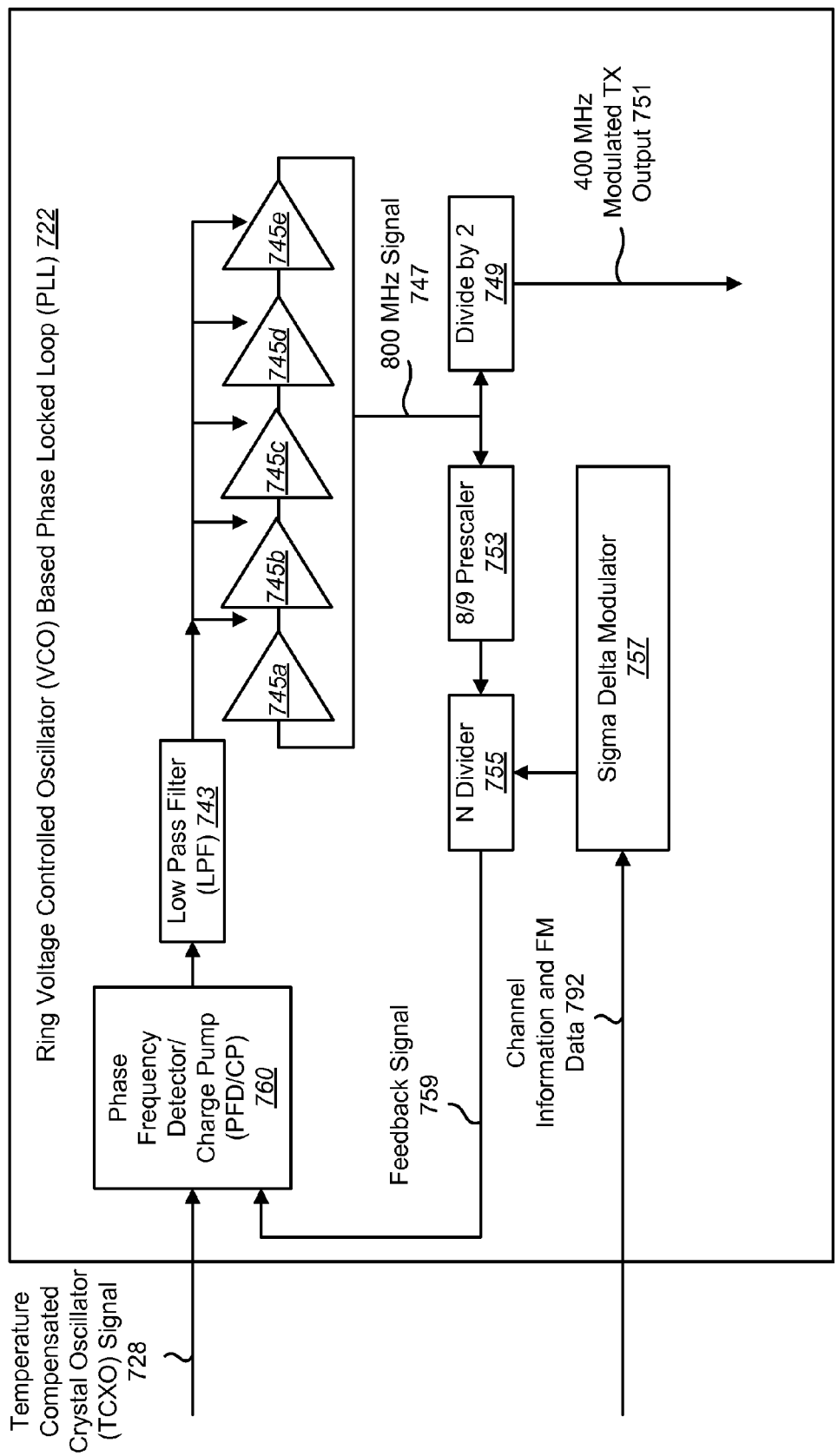
FIG. 7 is a block diagram illustrating a ring voltage controlled oscillator (VCO) based phase locked loop (PLL) for use in the present systems and methods.

FIG. 7 is a block diagram illustrating a ring voltage controlled oscillator (VCO) based phase locked loop (PLL) 722 for use in the present systems and methods. The ring voltage controlled oscillator (VCO) based phase locked loop (PLL) 722 of FIG. 7 may be one configuration of the ring voltage controlled oscillator (VCO) based phase locked loop (PLL) 122 of FIG. 1. The number of delay units 745*a-e* in the ring voltage controlled oscillator (VCO) based phase locked loop (PLL) 722 may be half that of a delay locked loop (DLL) based Rx approach. The ring voltage controlled oscillator (VCO) based phase locked loop (PLL) 722 may include a phase frequency detector/charge pump (PFD/CP) 760. The phase frequency detector/charge pump (PFD/CP) 760 may receive a temperature compensated crystal oscillator (TXCO) signal 728 from an external temperature compensated crystal oscillator (TXCO) 326. The phase frequency detector/charge pump (PFD/CP) 760 may also receive a feedback signal 759 from an N divider 755 on the ring voltage controlled oscillator (VCO) based phase locked loop (PLL) 722. The output of the phase frequency detector/charge pump (PFD/CP) 760 may be input to a low pass filter (LPF) 743.

The output of the low pass filter (LPF) 743 may control a first delay unit 745*a*, a second delay unit 745*b*, a third delay unit 745*c*, a fourth delay unit 745*d* and a fifth delay unit 745*e*. The output of the first delay unit 745*a* may be the input of the second delay unit 745*b*. The output of the second delay unit 745*b* may be the input of the third delay unit 745*c*. The output of the third delay unit 745*c* may be the input of the fourth delay unit 745*d*. The output of the fourth delay unit 745*d* may be the input of the fifth delay unit 745*e*. The output of the fifth delay unit 745*e* may be the input of the first delay unit 745*a*. The output of the fifth delay unit 745*e* may be an 800 MHz signal 747. The 800 MHz signal 747 may also be input to an ⅝ prescaler 753. The output of the ⅝ prescaler 753 may be input to the N divider 755.

The ring voltage controlled oscillator (VCO) based phase locked loop (PLL) 722 may include a sigma delta modulator 757. The sigma delta modulator 757 may receive channel information and FM data 792. The sigma delta modulator 757 may enable the ring voltage controlled oscillator (VCO) based phase locked loop (PLL) 722 to achieve fractional division. The N divider may receive the output of the ⅝ prescaler 753 and the output of the sigma delta modulator 757. The 800 MHz signal 747 may further be input to a divide by 2 block 749. The divide by 2 block 749 may then output a 400 MHz modulated TX output signal 751.

Figure 8:
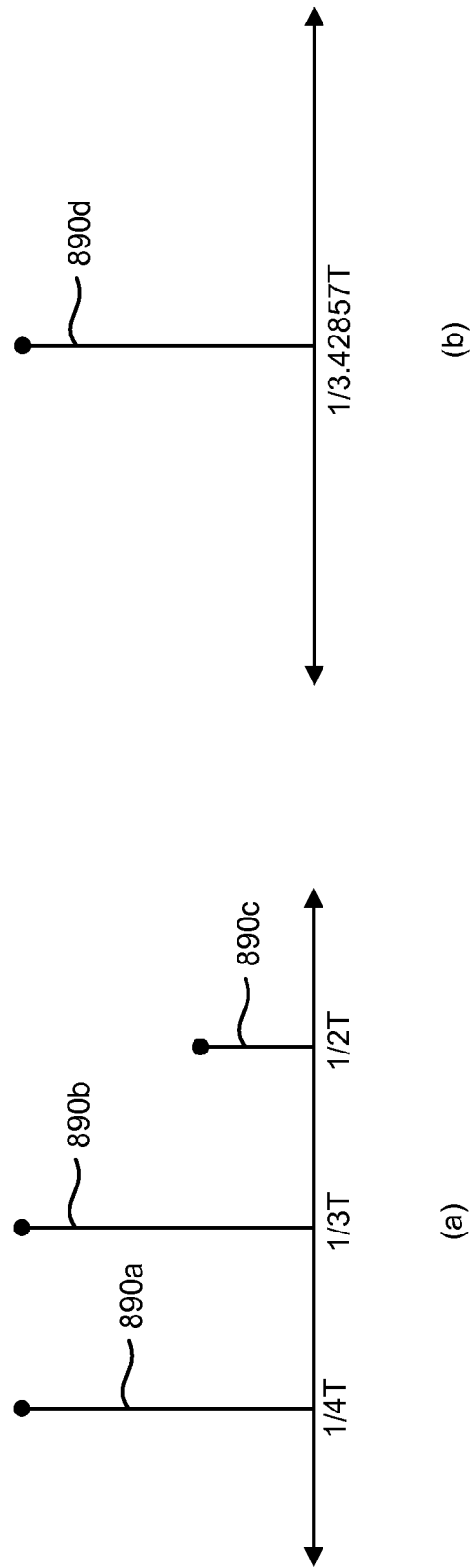
FIG. 8 illustrates waveforms generated for a delay locked loop (DLL) based inphase/quadrature (I/Q) generator.

FIG. 8 illustrates waveforms generated for a delay locked loop (DLL) based inphase/quadrature (I/Q) generator 324. The waveforms illustrate frequency (on the x-axis) versus amplitude (on the y-axis). In (a), the waveform is shown as viewed using a very fine spectrum analyzer with multiple frequency tones 890*a-c*. System level simulation may be performed to determine how much resolution is required to achieve a single frequency tone 890*d*, as illustrated in (b), which can meet the phase noise specification.

Figure 9:
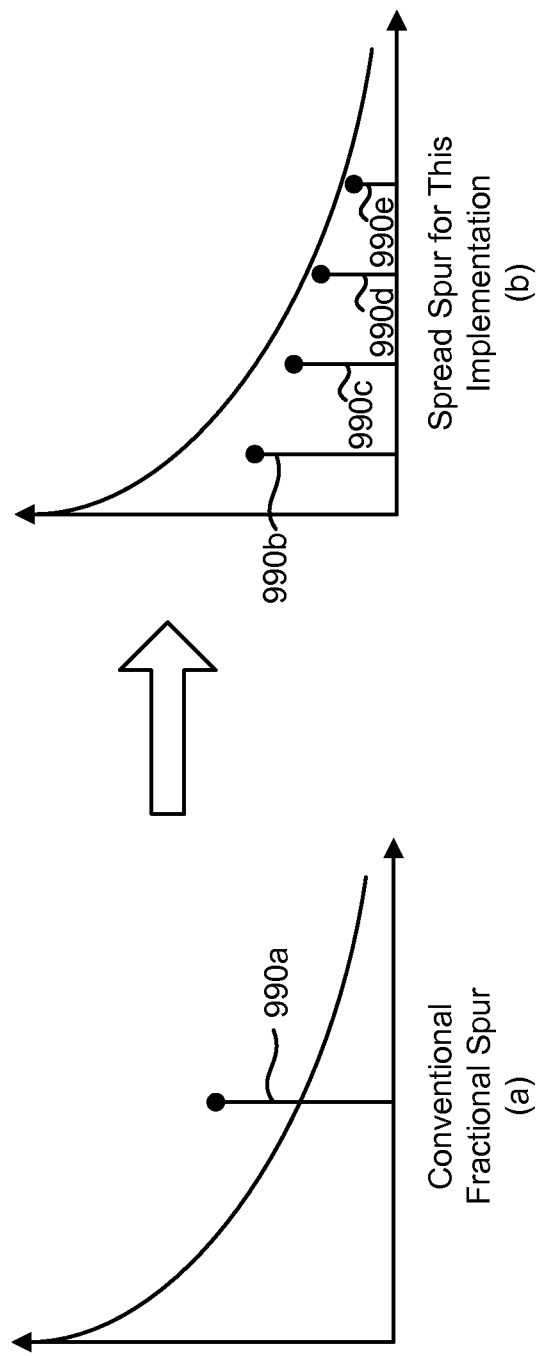
FIG. 9 illustrates a possible dithering of a fractional spur.

FIG. 9 illustrates a possible dithering of a fractional spur 990*a-e*. One negative approach of using a delay locked loop (DLL) based inphase/quadrature (I/Q) generator 524 is the potential for the delay locked loop (DLL) based inphase/quadrature (I/Q) generator 524 to contribute an extra spur 990 to received signals 340. A steady state error at the phase frequency detector/charge pump (PFD/CP) 560 in the delay locked loop (DLL) based inphase/quadrature (I/Q) generator 524 may cause an extra reference spur 990*a*. There is also an inherent fractional spur issue unless the delay locked loop (DLL) based inphase/quadrature (I/Q) generator 524 dithers the transition. The amplitude of the fractional spur 990*a* may be greater than a spur specification.

A unit delay difference between different phases may increase the fractional spur 990*a* even more. The unit delay difference between different phases may be calibrated out. If no Sigma Delta (SD) noise dithering is implemented, fractional spurs 990*a* may be very prominent at the inphase/quadrature (I/Q) for Rx signal 336. By turning on the switches 686 in the phase selector and counter logic 668 at different cycles, the fractional spur 990*a* that violates the spur specification (shown in (a)) may be spread so as to not violate the spur specification (shown as the multiple spurs 990*b-e* in (b)). For example, instead of dithering between N and N+k, dithering between $$\frac{N+1}{K} \text{ and } \frac{N+2}{K}$$

may be used to reduce the absolute amount of quantization noise.

Figure 10:
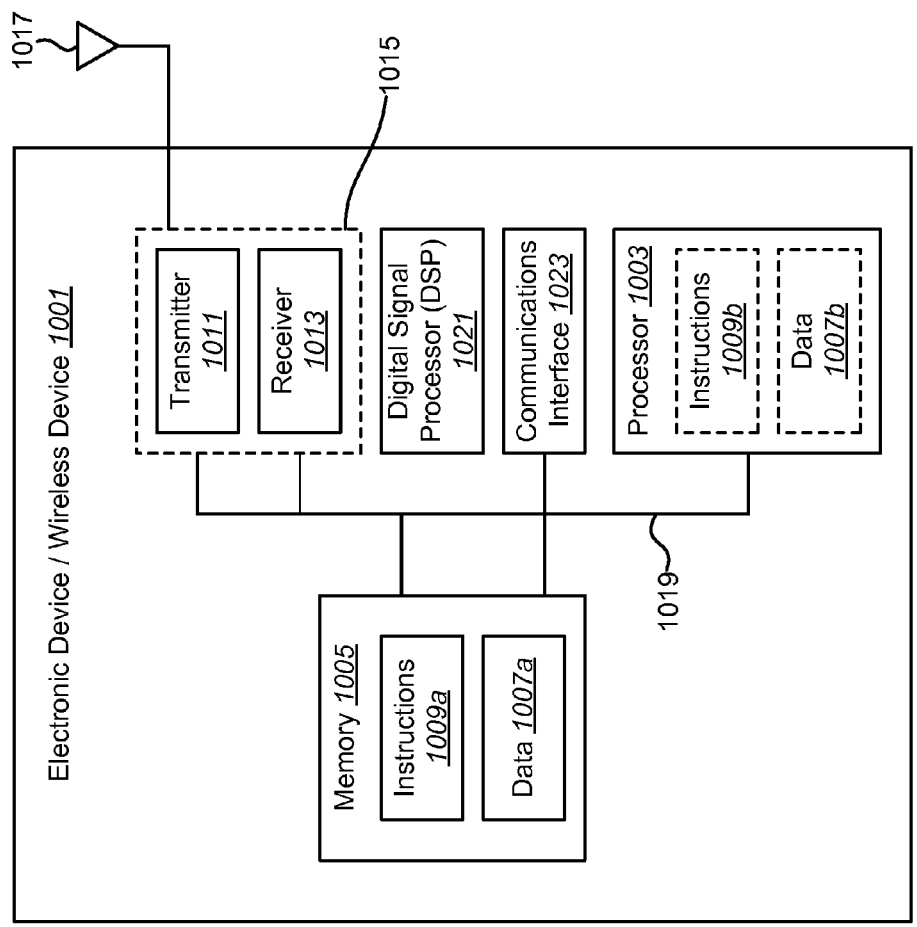
FIG. 10 shows part of a hardware implementation of an electronic device/wireless device that uses a clock sharing between multiple cores on an integrated circuit.

FIG. 10 illustrates certain components that may be included within an electronic device/wireless device 1001 that uses clock sharing between multiple cores on an integrated circuit 102. The electronic device/wireless device 1001 may be an access terminal, a mobile station, a wireless communication device, a base station, a Node B, a handheld electronic device, etc. The electronic device/wireless device 1001 includes a processor 1003. The processor 1003 may be a general purpose single- or multi-chip microprocessor (e.g., an ARM), a special purpose microprocessor (e.g., a digital signal processor (DSP)), a microcontroller, a programmable gate array, etc. The processor 1003 may be referred to as a central processing unit (CPU). Although just a single processor 1003 is shown in the electronic device/wireless device 1001 of FIG. 10, in an alternative configuration, a combination of processors (e.g., an ARM and DSP) could be used.

The electronic device/wireless device 1001 also includes memory 1005. The memory 1005 may be any electronic component capable of storing electronic information. The memory 1005 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1007*a* and instructions 1009*a* may be stored in the memory 1005. The instructions 1009*a* may be executable by the processor 1003 to implement the methods disclosed herein. Executing the instructions 1009*a* may involve the use of the data 1007*a* that is stored in the memory 1005. When the processor 1003 executes the instructions 1009*a*, various portions of the instructions 1009*b* may be loaded onto the processor 1003, and various pieces of data 1007*b* may be loaded onto the processor 1003.

The electronic device/wireless device 1001 may also include a transmitter 1011 and a receiver 1013 to allow transmission and reception of signals to and from the electronic device/wireless device 1001. The transmitter 1011 and receiver 1013 may be collectively referred to as a transceiver 1015. An antenna 1017 may be electrically coupled to the transceiver 1015. The electronic device/wireless device 1001 may also include (not shown) multiple transmitters, multiple receivers, multiple transceivers and/or multiple antennas.

The electronic device/wireless device 1001 may include a digital signal processor (DSP) 1021. The electronic device/wireless device 1001 may also include a communications interface 1023. The communications interface 1023 may allow a user to interact with the electronic device/wireless device 1001.

The various components of the electronic device/wireless device 1001 may be coupled together by one or more buses, which may include a power bus, a control signal bus, a status signal bus, a data bus, etc. For the sake of clarity, the various buses are illustrated in FIG. 10 as a bus system 1019.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC- FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL) or wireless technologies such as infrared, radio and microwave, then the coaxial cable, fiber optic cable, twisted pair, DSL or wireless technologies such as infrared, radio and microwave are included in the definition of transmission medium.

Further, it should be appreciated that modules and/or other appropriate means for performing the methods and techniques described herein, such as those illustrated by FIG. 2 and FIG. 4, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the systems, methods, and apparatus described herein without departing from the scope of the claims.

No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An integrated circuit comprising:
 a first core that generates a clock signal using an inductor-capacitor voltage controlled oscillator, wherein the clock signal is generated for wireless communication by the first core, and wherein the first core is a global positioning system core; and
 a second core configured to use the clock signal for wireless communication, wherein the second core is an Frequency Modulation FM transceiver core, and wherein the FM transceiver core comprises a delay locked loop based inphase/quadrature generator that uses the clock signal to generate an FM receiver clock signal.

2. The integrated circuit of claim 1, wherein the clock signal is a GPS clock signal.

3. The integrated circuit of claim 2, wherein the transceiver core does not comprise a voltage controlled oscillator.

4. The integrated circuit of claim 1, wherein the FM transceiver core comprises an FM transmitter and an FM receiver.

5. The integrated circuit of claim 4, wherein the FM receiver comprises the delay locked loop based inphase/quadrature generator, and wherein the FM receiver clock signal is an inphase/quadrature for Rx signal.

6. The integrated circuit of claim 5, wherein the inphase/quadrature for Rx signal is mixed with a receive signal to obtain a baseband signal.

7. The integrated circuit of claim 5, wherein the delay locked loop based inphase/quadrature generator is implemented using delay locked loop based phase counting frequency division.

8. The integrated circuit of claim 7, wherein the delay locked loop based inphase/quadrature generator comprises a series of delay units coupled to phase selector and counter logic.

9. The integrated circuit of claim 8, wherein the phase selector and counter logic comprises multiple switches, and wherein adjusting a phase and turn-on time for each switch adjusts a frequency output of the phase selector and counter logic.

10. The integrated circuit of claim 4, wherein the FM transmitter comprises a ring voltage controlled oscillator based phase locked loop.

11. The integrated circuit of claim 10, wherein the ring voltage controlled oscillator based phase locked loop receives a temperature compensated crystal oscillator signal from an external temperature compensated crystal oscillator.

12. The integrated circuit of claim 11, wherein the ring voltage controlled oscillator based phase locked loop comprises:
    a phase frequency detector/charge pump;
    a low pass filter; and
    and multiple delay units.

13. The integrated circuit of claim 2, wherein the integrated circuit is a system-on-a-chip.

14. A method for sharing a clock signal between a first core and a second core on an integrated circuit, the method comprising:
    generating a clock signal using an inductor-capacitor voltage controlled oscillator in the first core on the integrated circuit, wherein the clock signal is generated for wireless communication by the first core, and wherein the first core is a global positioning system core;
    providing the clock signal to the second core on the integrated circuit, wherein the second core is an Frequency Modulation FM transceiver core, and wherein the FM transceiver core comprises a delay locked loop based inphase/quadrature generator that uses the clock signal to generate an FM receiver clock signal; and
    using the FM receiver clock signal to receive signals on the second core.

15. The method of claim 14, wherein the clock signal is a GPS clock signal.

16. The method of claim 15, wherein the transceiver core does not comprise a voltage controlled oscillator.

17. The method of claim 14, wherein the FM transceiver core comprises an FM transmitter and an FM receiver.

18. The method of claim 17, wherein the FM receiver comprises the delay locked loop based inphase/quadrature generator, and further comprising using the clock signal and the delay locked loop based inphase/quadrature generator to generate an inphase/quadrature for Rx signal.

19. The method of claim 18, further comprising mixing the inphase/quadrature for Rx signal with a receive signal to obtain a baseband signal.

20. The method of claim 18, wherein the delay locked loop based inphase/quadrature generator is implemented using delay locked loop based phase counting frequency division.

21. The method of claim 20, wherein the delay locked loop based inphase/quadrature generator comprises a series of delay units coupled to phase selector and counter logic.

22. The method of claim 21, wherein the phase selector and counter logic comprises multiple switches, and wherein adjusting a phase and turn-on time for each switch adjusts a frequency output of the phase selector and counter logic.

23. The method of claim 17, wherein the FM transmitter comprises a ring voltage controlled oscillator based phase locked loop.

24. The method of claim 23, wherein the ring voltage controlled oscillator based phase locked loop receives a temperature compensated crystal oscillator signal from an external temperature compensated crystal oscillator.

25. The method of claim 24, wherein the ring voltage controlled oscillator based phase locked loop comprises:
    a phase frequency detector/charge pump;
    a low pass filter; and
    and multiple delay units.

26. The method of claim 15, wherein the integrated circuit is a system-on-a-chip.

27. An apparatus configured for sharing a clock signal between a first and a second core on an integrated circuit, comprising:
    means for generating a clock signal using an inductor-capacitor voltage controlled oscillator in the first core on the integrated circuit, wherein the clock signal is generated for wireless communication by the first core, and wherein the first core is a global positioning system core;
    means for providing the clock signal to the second core on the integrated circuit, wherein the second core is an Frequency Modulation FM transceiver core, and wherein the FM transceiver core comprises a delay locked loop based inphase/quadrature generator that uses the clock signal to generate an FM receiver clock signal; and
    means for using the clock signal to receive signals on the second core.

28. The apparatus of claim 27, wherein the clock signal is a GPS clock signal.

29. The apparatus of claim 28, wherein the transceiver core does not comprise a voltage controlled oscillator.

30. A computer-program product for sharing a clock signal between a first core and a second core, the computer-program product comprising a non-transitory computer-readable medium having instructions thereon, the instructions comprising:
    code for causing an electronic device to generate a clock signal using an inductor-capacitor voltage controlled oscillator in the first core, wherein the clock signal is generated for wireless communication by the first core, and wherein the first core is a global positioning system core;
    code for causing the electronic device to provide the clock signal to the second core, wherein the second core is an FM transceiver core, and wherein the FM transceiver core comprises a delay locked loop based inphase/quadrature generator that uses the clock signal to generate an FM receiver clock signal; and
    code for causing the electronic device to use the clock signal to receive signals on the second core.

31. The computer-program product of claim 30, wherein the clock signal is a GPS clock signal.

32. The computer-program product of claim 31, wherein the transceiver core does not comprise a voltage controlled oscillator.

* * * * *